United States Patent
Kalte et al.

(10) Patent No.: US 12,348,236 B2
(45) Date of Patent: Jul. 1, 2025

(54) METHOD FOR CHANGING A BITWIDTH OF AN FPGA CONFIGURATION

(71) Applicant: dSPACE GmbH, Paderborn (DE)

(72) Inventors: Heiko Kalte, Paderborn (DE); Dominik Lubeley, Paderborn (DE)

(73) Assignee: dSPACE GMBH, Paderborn (DE)

( * ) Notice: Subject to any disclaimer, the term of this patent is extended or adjusted under 35 U.S.C. 154(b) by 412 days.

(21) Appl. No.: 18/082,345

(22) Filed: Dec. 15, 2022

(65) Prior Publication Data

US 2023/0198532 A1     Jun. 22, 2023

(30) Foreign Application Priority Data

Dec. 17, 2021    (DE) ..................... 10 2021 133 732.1
Dec. 17, 2021    (EP) ..................... 21215421

(51) Int. Cl.
*G06F 30/34*      (2020.01)
*H03L 7/107*      (2006.01)

(52) U.S. Cl.
CPC .............. *H03L 7/107* (2013.01); *G06F 30/34* (2020.01)

(58) Field of Classification Search
None
See application file for complete search history.

(56) References Cited

U.S. PATENT DOCUMENTS

| | | |
|---|---|---|
| 6,762,994 B1 | 7/2004 | Mitchell et al. |
| 2018/0010943 A1 | 1/2018 | Xu et al. |
| 2021/0157602 A1* | 5/2021 | Akoglu ............... G06F 12/0284 |

OTHER PUBLICATIONS

Wagle, Ankit et al: "FPGAs with Reconfigurable Threshold Logic Gates for Improved Performance, Power and Area" 2018 International Conference on Field-Programmable Logic and Applications, IEEE, Aug. 27, 2018, pp. 256-259, XP033462489, DOI: 10.1109/FPL.2018.00051.

* cited by examiner

*Primary Examiner* — Idowu O Osifade
(74) *Attorney, Agent, or Firm* — Muncy, Geissler, Olds & Lowe, P.C.

(57) ABSTRACT

A method for changing a bitwidth of an FPGA configuration for an FPGA, the FPGA configuration having a plurality of at least $2^n$ bit-containing data signals with $n \in \mathbb{N}$ and $\geq 3$, and the method having the step: when a threshold of a current consumption and/or a temperature of the FPGA is exceeded and/or a replacement signal is present, replacing k least significant bits of the data signals in each case with a zero with $k \in \mathbb{N}$ and $\geq 2$ during an execution of the FPGA configuration on the FPGA.

12 Claims, 3 Drawing Sheets

METHOD FOR CHANGING A BITWIDTH OF AN FPGA CONFIGURATION

This nonprovisional application claims priority under 35 U.S.C. § 119(a) to German Patent Application No. 10 2021 133 732.1, which was filed in Germany on Dec. 17, 2021, and to European Patent Application No. 21215421.5, which was filed on Dec. 17, 2021, and which are both herein incorporated by reference.

BACKGROUND OF THE INVENTION

Field of the Invention

The present invention relates to a method for changing a bitwidth of an FPGA configuration for an FPGA, the FPGA configuration having a plurality of at least $2^n$ bit-containing data signals with $n \in \mathbb{N}$ and $\geq 3$.

Description of the Background Art

An FPGA is an integrated circuit in digital technology to which a logic circuit can be loaded. In contrast to programming computers, microcontrollers, and controllers, the term "programming" or "construction of the FPGA" in terms of FPGAs means not only specifying time sequences but also defining the targeted circuit structure. This circuit structure is formulated with the aid of a hardware description language and then translated by software into a configuration file, which specifies how the elements in the FPGA are to be connected. In FPGA programming, a description of the hardware structure is thus generated, which is then transferred to the actual FPGA with the aid of synthesis tools and routing tools.

This hardware description typically takes place in special languages, such as VHDL or Verilog. Instead of "FPGA programming," this is therefore also referred to as "FPGA configuration." In contrast to programming computers, microprocessors, and controllers, the FPGA programming is thus not aimed at a predefined operating system and a driver basis. Instead, the FPGA programming is aimed at defining structures in the semiconductor, which carry out the intended functions later on. In this way, a degree of specialization and parallelism may be achieved, which is difficult to reach by conventional, prefabricated microprocessors.

In the field of hardware-in-the-loop simulation (HiL simulation) and in rapid control prototyping systems (RCP systems), real-time simulations, for example, in the technical fields of power electronics and electromobility, have long since no longer been covered by pure processor models. In many applications, such as simulations in which extremely fast control loops are needed, the latter must be supplemented or even replaced by FPGA models. Such hardware for HIL simulations and in rapid control prototyping systems has a variety of FPGAs for different functionalities or circuit components, for example, FPGAs for communication in a real-time network and FPGAs that can realize different I/O functionalities on I/O channels.

By means of abstracting FPGA development environments, users can develop their own hardware even without detailed knowledge of an FPGA and tool-flows. In the area of rapid control prototyping (RCP), fast control loops can be designed on the FPGA and operated, for example, on a hardware board as a prototype controller. With the increasing requirements for fast control loops, for example, in the e-drive environment, in power electronics, or in engine control, for example, for in-cylinder pressure measurement, more and more powerful FPGAs are needed. In the future, this trend will be intensified further by outsourcing resource-intensive algorithms, such as, for example, image processing, from driver assistance systems.

In this respect, it can be assumed that so-called prototyping platforms will have to cover a much wider range of users in the future than they did 5 years ago. Thus, it can be assumed that user B runs computationally intensive driver assistance systems on the same FPGA platform on which user A runs only a small PWM measurement and control. Here, user A's design may use the entire FPGA area but only 2 watts of power, whereas user B's design uses only half the FPGA area but requires 8 watts of power. Similarly, user C may use the entire FPGA like user A but require 20 watts of power because his system is more "active," for example, has a higher toggle rate. However, the power consumption is proportional to the toggle rate of the switching elements, for example, flip-flops, in an FPGA.

In the field of rapid control prototyping (RCP), there is often no time for a time-intensive and precise performance analysis to pre-qualify an FPGA real-time application when there are spontaneous changes to the control model. If a watchdog of the FPGA kicks in during operation, for example, during a test drive with a thermal overload, it has so far been left to the user to manually activate possible power-saving mechanisms in his FPGA configuration. Such changes are very costly, however.

SUMMARY OF THE INVENTION

It is therefore an object of the present invention to provide a method by which an FPGA configuration can be operated in a power-adaptive manner to be able to dynamically respond to excessive power consumption.

According to an exemplary embodiment, the object is achieved by a method for changing a bitwidth of an FPGA configuration for an FPGA, the FPGA configuration having a plurality of at least $2^n$ bit-containing data signals with $n \in \mathbb{N}$ and $\geq 3$ and the method having the step: when a threshold of a current consumption and/or a temperature of the FPGA is exceeded and/or a replacement signal is present, replacing k least significant bits of the data signals in each case with a zero with $k \in \mathbb{N}$ and $\geq 2$ during an execution of the FPGA configuration on the FPGA.

With the proposed method, an FPGA can be operated in a power-adaptive manner to be able to dynamically respond to excessive power consumption. Specifically, it is proposed that the bitwidth can be dynamically adjusted at runtime of an FPGA configuration. In other words, a (pseudo-) bitwidth adjustment is proposed, which is performed dynamically, when the threshold is exceeded, therefore, when a current consumption and/or temperature of the FPGA are exceeded. Accordingly, it is possible to react dynamically to excessive power consumption and/or temperatures of the FPGA.

Processors usually natively handle only integer and floating-point data types according to IEEE 754. The processor architecture determines the bitwidths, which are 32 bits, so-called single precision, and 64 bits, so-called double precision, for floating point. Any bitwidths are possible in an FPGA, because a corresponding logic can be generated for this in the FPGA. A so-called floating point modeling is regularly used. However, the availability of increasingly larger FPGAs and the support of floating point modeling in FPGA modeling tools lead to a higher FPGA resource requirement of floating point modeling and to increased power consumption, because the full bitwidth of usually 32 bits or 64 bits is always used for computation. However, the proposed method solves this dilemma because the switching activity or toggle rate of the switching elements in the FPGA is reduced, for example, flip-flops, each of which results in a reload.

Replacing with a zero, also called zeroing, is preferably applicable to a mantissa of a floating point data type and/or fixed point data type. In this way, the FPGA configuration can be simulated with reduced precision. The number of k bits to be set to zero can be variably adjustable. By bitwise feeding in of the replacement value 0 for, for example, the lower 29 bits of the mantissa, the precision of a double precision data signal can be reduced to that of a single precision data signal, which is sufficient for many applications, however.

In summary, an adaptive FPGA power regulation in the FPGA thermal exception state is proposed instead of an FPGA shutdown as practiced in the prior art in the RCP controller. Whereas in the prior art only a reduction of the time resolution or precision is possible, fast control loops can be left fast by the proposed method and only the resolution or precision can be reduced. The power saving achieved thereby is independent of the clock region. It is conceivable further that hot regions of the FPGA are specifically "cooled down" if these hot regions are known and the data width is specifically reduced there using the proposed method. Finally, the proposed method contributes to the functional safety and allows arbitrary arithmetic units to be manipulated without the need to adjust datapath elements.

According to an example, the replacing comprises inserting at least one controller and at least one signal control block, which at least one signal control block is configured to replace the k least significant bits of the data signals in each case with a zero, and which at least one controller is configured to control the at least one signal control block for replacing when the threshold of the current consumption and/or the temperature of the FPGA is exceeded and/or the replacement signal is present. Preferably, the controller is set up to measure the current consumption of the FPGA and/or the temperature of the FPGA. As soon as the measured current consumption and/or temperature exceed a threshold, the controller can activate the signal control block of at least one data signal. As a result, the signal control block can reduce a bitwidth of the data signal by setting the k least significant bits to zero. The signal control block can be inserted into I/O data signal blocks, especially ports, constant, multiplication, division, and/or DFT blocks. Similarly, the signal control block can be inserted into addition, subtraction, register, delay, shift, relation, upsample, downsample, and/or BRAM blocks.

Provided that the I/O data signal receives fixed-point data, it can be recognized from a model analysis whether the data signal is reducible, and in particular only then the signal control block can be inserted. Likewise, the signal control block at which bitwidth reduction occurs can be selected with fine granularity. A corresponding selection control can take place with a hysteresis, it being possible to work with the full bitwidth again only after falling below a second lower threshold value. Further, the controller can be parameterizable via a dedicated area of the FPGA or an external processor. Alternatively, the controller can be shown in a modeling program, for example, Simulink, and the bitwidth reduction can be parameterized by a user.

The method can also comprise the step: replacing the k least significant bits of all data signals in each case with a zero.

Accordingly, it is provided that the k least significant bits (LSB) of all data signals are replaced with a zero in each case. This can take place, for example, on the basis of the replacement signal, which can be set manually by a user, for example, in order to obtain in particular a current consumption and/or temperature that still lie below the threshold value.

Also, the method comprises the step: cutting out the k least significant bits of the data signals and inserting zeros as the k least significant bits of the data signals.

The cutting out can be done in particular by the controller and/or signal control block described above, in particular by a so-called slice element.

Further, the method comprises the step: executing the FPGA configuration in only every m-th clock of the FPGA with $m \in \mathbb{N}$ and $\geq 2$.

In addition to bitwidth reduction, a clock frequency of the FPGA can be reduced, or a reduced execution rate can be achieved via clock enable gating. According to another preferred refinement, m can be changed during the execution. In this respect, for example, the FPGA configuration can only be executed in every $m=3^{rd}$, $4^{th}$, or $5^{th}$ clock. Likewise, parts of the FPGA's computational logic can be switched off. Such measures can further reduce the power consumption and/or temperature of the FPGA.

The object of the invention is further achieved by a computer-implemented method for creating an FPGA configuration having a plurality of at least $2^n$ bit-containing data signals with $n \in \mathbb{N}$ and $\geq 3$, comprising the steps: inserting at least one signal control block into an FPGA model and/or netlist and/or an HDL code of the FPGA configuration, wherein the signal control block is configured to replace k least significant bits of the data signals in each case with a zero with $k \in \mathbb{N}$ and $\geq 2$; inserting at least one controller into the FPGA model and/or the netlist and/or the HDL code of the FPGA configuration, which is designed to control the at least one signal control block for replacing when a threshold of a current consumption and/or a temperature of the FPGA is exceeded and/or a replacement signal is present; and transferring the FPGA configuration with the at least one inserted signal control block and the at least one inserted controller to the FPGA.

The computer-implemented process allows the FPGA configuration to be created, which is subsequently transferable to and executable by the FPGA. With respect to the method proposed above, which is executable during an execution of the FPGA configuration, the computer-implemented method represents an alternative solution to the aforementioned object of the invention, which achieves the aforementioned object of the invention prior to execution on the FPGA. In this respect, it is inappropriate to recite these two methods in a single claim.

In other words, the signal control block and the controller can be inserted by the method directly into a graphical model, i.e., the FPGA model, at a higher 'abstraction level'; this is easy to realize in this respect. In this way, a simulation can be used to check the desired control behavior before the time-consuming steps of creating and placing the netlist are carried out.

The term HDL code refers to code in a hardware description language, such as, for example, VHDL or Verilog. VHDL, written out as very high speed integrated circuit hardware description language or also referred to as VHSIC hardware description language, is known to the skilled artisan as a hardware description language with which it is possible to describe digital systems in a text-based manner.

VHDL has been established as an IEEE standard since 1987 and has equally standardized language extensions where applicable.

The data signals can comprise a bitwidth of 8, 16, 32, 64, or 80 bits and/or $k \geq 2^{n-2}$. According to another preferred refinement, $n=6$ and $k=29$. By bitwise feeding in the replacement value 0 for, for example, the lower 29 bits of the mantissa in the case of $k=29$ and $n=6$, the precision of a double precision signal can be reduced to that of a single precision signal, so that a generally sufficient precision is still obtained at a substantially low current consumption and/or temperature.

The object is further achieved by an FPGA configuration comprising a bitstream which, when written to a configuration layer of an FPGA, sets it up to execute a method as described previously. The FPGA configuration can be created either graphically using a schematic, or textually using a hardware description language, such as, for example, VHDL or Verilog, which can describe the entire function of the circuit in terms of structures and sequences. A so-called synthesis tool executes this description like a program and creates in several steps a specific netlist for a desired FPGA using the resources available in this FPGA.

The object is achieved in addition by an FPGA comprising at least one controller and at least one signal control block for executing a method as previously described. The FPGA can be designed as known from the prior art, in particular having an array of basic blocks each with a simple programmable lookup table, LUT, and a 1-bit register, flip-flop. The LUTs can realize any n-digit binary function, depending on the number of available inputs. A programming of a desired function occurs by storing a defining truth table in SRAM cells of the LUT, and a function calculation occurs by reading a memory address determined by inputs.

The FPGA can have a current sensor and/or a temperature sensor configured to determine the current consumption and/or temperature of the FPGA. The current sensor and/or the temperature sensor are preferably provided directly on and/or connected to the FPGA.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
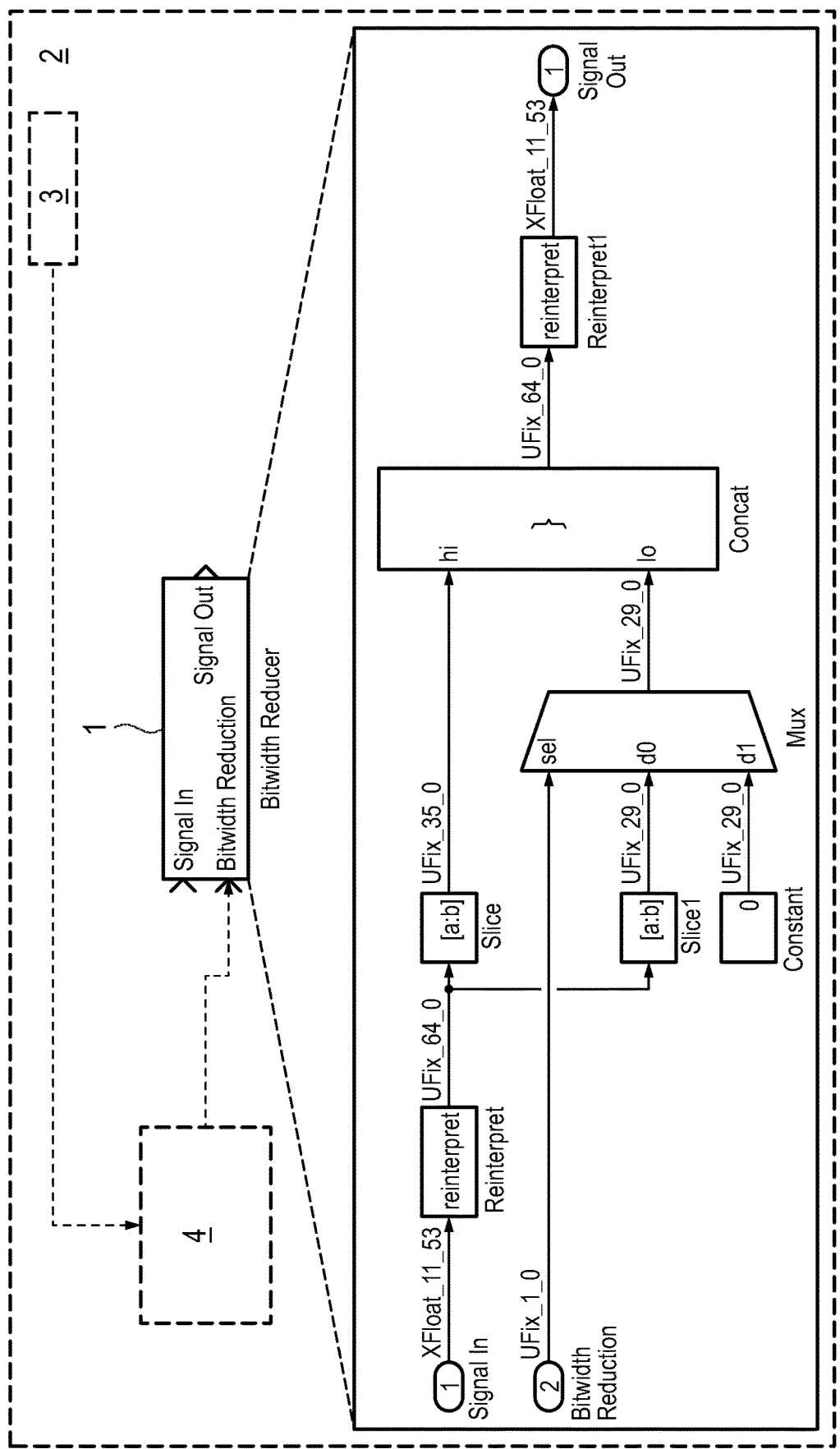
FIG. 1 shows a schematic view of a controller and a signal control block for reducing the precision from double precision to single precision at runtime according to a preferred exemplary embodiment of the invention.

FIG. 1 shows a schematic view of a controller 4 and a signal control block 1 for changing a bitwidth of an FPGA configuration for an FPGA 2, which is shown only schematically.

Figure 2:
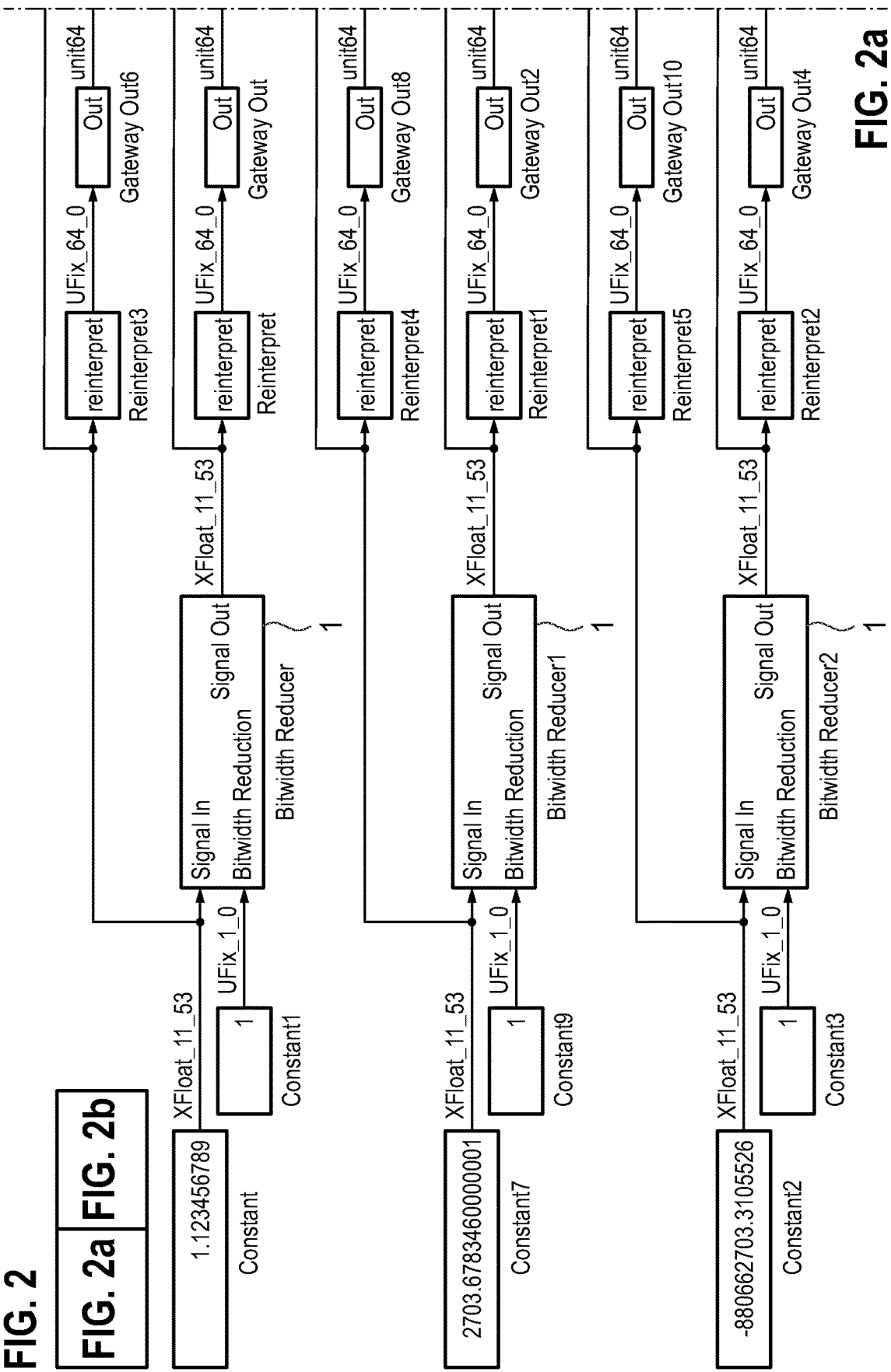
FIGS. 2a and 2b show an example of dynamic bitwidth adjustment for the lower 29 bits of an FPGA configuration for reducing the precision from double precision to single precision according to the preferred exemplary embodiment of the invention.
Figure 2B:
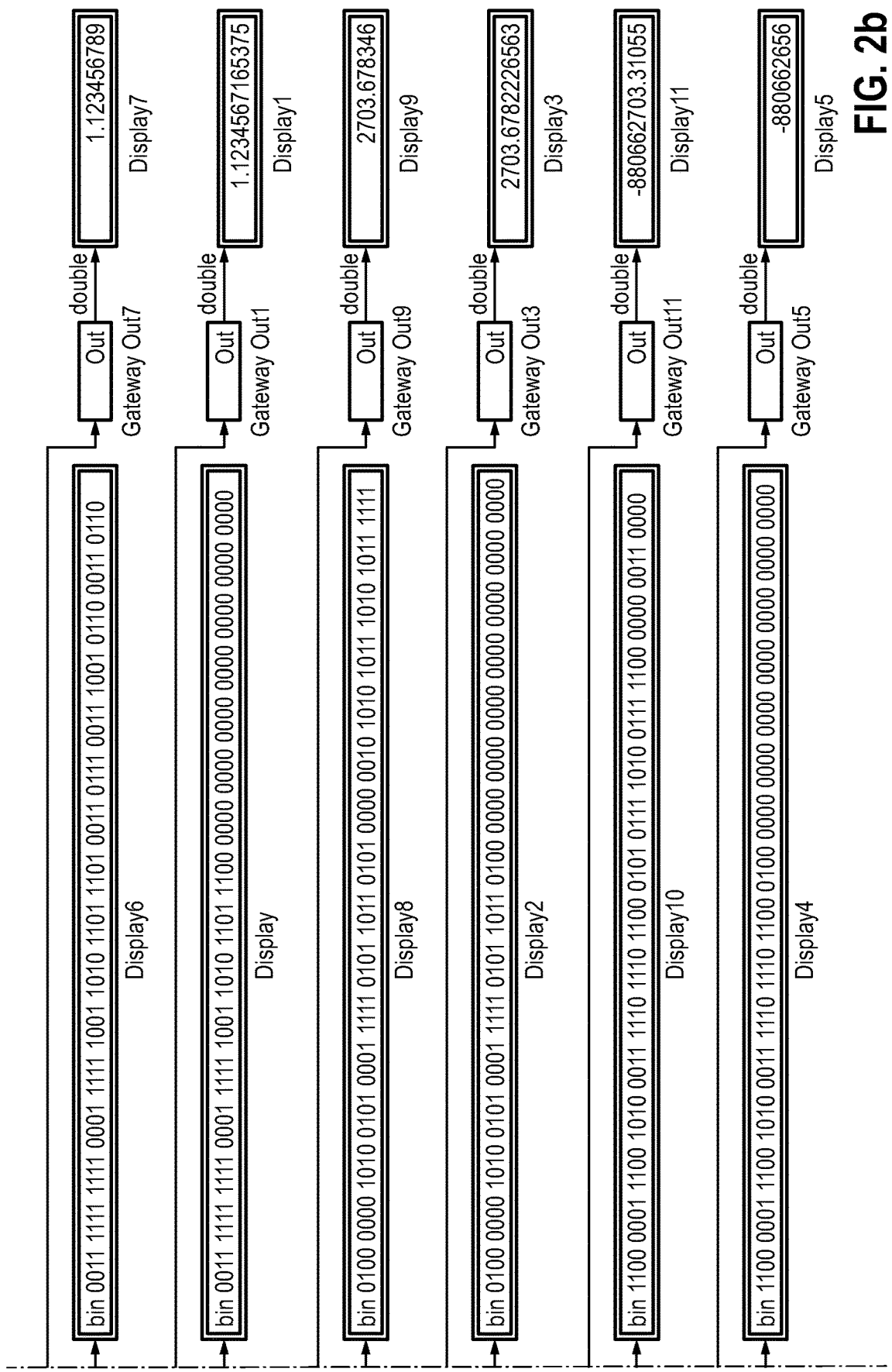

The FPGA configuration has a plurality of at least $2^n$ bit-containing data signals with $n \in \mathbb{N}$ and $\geq 3$. In the proposed method, when a threshold of a current consumption and/or a temperature of FPGA 2 is exceeded and/or a replacement signal is present during an execution of the FPGA configuration on FPGA 2, the k least significant bits of the data signals are each replaced with a zero with $k \in \mathbb{N}$ and $\geq 2$ by controller 4 and signal control block 1. For $n=6$ and $k=29$, therefore, for a 64 bit data signal, the method leads to a reduction in precision from double precision to single precision. FIGS. 2a and 2b show a corresponding example for dynamic bitwidth adjustment for the lower 29 bits of the FPGA configuration according to the preferred exemplary embodiment of the invention.

Specifically, the method includes the following steps:

First, an automatic modification of an FPGA model/netlist/VHDL code takes place as an FPGA configuration before an FPGA build in a temporary model/netlist/VHDL code in which controller 4 and signal control block 1 are inserted for adaptive dynamic bitwidth adjustment. The power consumption and/or the temperature of FPGA 2, which can be determined by means of a current sensor and/or temperature sensor 3 shown only schematically, serve as a reference variable.

Likewise, the reference variable can be specified externally by a user as a replacement signal, for example, if the power consumption is to be reduced even further below the threshold value. Controller 4 can further be equipped with a hysteresis function in the case of reducing and returning to full precision. Also optionally, the controller can be parameterized by FPGA 2 or an external processor. Thus, it can be provided that controller 4 receives an external replacement signal and thereupon activate the signal control block or blocks.

As already mentioned, the reference variables are the power consumption of FPGA 2, in particular as a short-term criterion, and/or the temperature of FPGA 2, in particular as a long-term criterion, and alternatively the replacement signal. Likewise, controller 4 can be provided for bitwidth adjustment already during modeling in the model and the user receives temperature and current as output signals of controller 4 to manually adjust the bitwidth. For this purpose, the "automatic system" can be deactivated in controller 4 via a replacement signal or replaced by an individually modeled specification for bitwidth reduction.

Subsequently, all possible model input blocks and calculation blocks are searched and the controller and signal control block 1 are inserted for all model input blocks that contain data signals. For floating point data signals, this can usually be clearly identified, whereas for fixed point data signals, a user may need to indicate whether a data signal contains data or bit masks/commands.

Alternatively, the blockset can automatically analyze whether the data signal is calculated in the model and is therefore a reducible data signal. Similarly, signal control block 1 is inserted for model calculation blocks which can optionally recover the zeroed least significant bits, for example, in a multiplexer. Finally, an output of controller 4 is connected to an input of signal control block 1.

As a result, the FPGA build of the model modified with the dynamic bitwidth adjustment is obtained, which can be executed as an FPGA configuration on the FPGA. If necessary, the FPGA configuration can be tested with reduced precision to verify that the controller does not become unstable as soon as the bitwidth is reduced.

With the specified switching from double precision to single precision, there is the possibility that 29 of the 64 bits can no longer be toggled. It has been shown experimentally that the power consumption is reduced by 45.3%. The power consumption can even be reduced by 65.6% in the case of half precision and by 79.7% in the case of quarter precision. An even further reduction in power consumption can be achieved if the FPGA configuration is performed with $m \in \mathbb{N}$ and $\geq 2$ in only every m-th clock of the FPGA, therefore, for example, only in every third or fourth clock.

The described exemplary embodiments are merely examples that can be modified and/or supplemented in a variety of ways within the scope of the claims. Any feature described for a particular exemplary embodiment can be used independently or in combination with other features in any other exemplary embodiment. Any feature that has been described for an exemplary embodiment of a particular category can also be used in a corresponding manner in an exemplary embodiment of another category.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for changing a bitwidth of an FPGA configuration for an FPGA, the method comprising:
    providing the FPGA configuration with a plurality of at least $2^n$ bit-containing data signals with $n \in \mathbb{N}$ and $\geq 3$; and
    replacing k least significant bits of the data signals in each case with a zero with $k \in \mathbb{N}$ and $\geq 2$ during an execution of the FPGA configuration on the FPGA when a threshold of a current consumption and/or a temperature of the FPGA is exceeded and/or a replacement signal is present.

2. The method according to claim 1, wherein the replacing comprises inserting at least one controller and at least one signal control block, which at least one signal control block is configured to replace the k least significant bits of the data signals with a zero, and wherein at least one controller is configured to control the at least one signal control block for replacing when the threshold of the current consumption and/or the temperature of the FPGA is exceeded and/or the replacement signal is present.

3. The method according to claim 1, further comprising: replacing the k least significant bits of all data signals in each case with a zero.

4. The method according to claim 1, further comprising: cutting out the k least significant bits of the data signals and inserting zeros as the k least significant bits of the data signals.

5. The method according to claim 1, further comprising: executing the FPGA configuration in only every m-th clock of the FPGA (2) with $m \in \mathbb{N}$ and $\geq 2$.

6. The method according to claim 5, wherein m is changable during the execution.

7. A computer-implemented method for creating an FPGA configuration comprising a plurality of at least $2^n$ bit-containing data signals with $n \in \mathbb{N}$ and $\geq 3$, the method comprising:
    inserting at least one signal control block into an FPGA model and/or netlist and/or an HDL code of the FPGA configuration, wherein the signal control block is configured to replace k least significant bits of the data signals in each case with a zero with $k \in \mathbb{N}$ and $\geq 2$;
    inserting at least one controller into the FPGA model and/or the netlist and/or the HDL code of the FPGA configuration, which is designed to control the at least one signal control block for replacing when a threshold of a current consumption and/or a temperature of the FPGA is exceeded and/or a replacement signal is present; and
    transferring the FPGA configuration with the at least one inserted signal control block and the at least one inserted controller to the FPGA.

8. The method according to claim 7, wherein the data signals comprise a bitwidth of 8, 16, 32, 64, or 80 bits and/or $k \geq 2^{n-2}$.

9. The method according to claim 7, wherein n=6 and k=29.

10. An FPGA configuration comprising a bitstream which, when written to a configuration layer of an FPGA sets up the FPGA to execute a method according to claim 1.

11. An FPGA comprising a processor to execute the method according to claim 1.

12. The FPGA according to claim 11, comprising a current sensor and/or a temperature sensor configured to determine the current consumption and/or the temperature of the FPGA.

* * * * *